United States Patent
Barkley et al.

(10) Patent No.: US 9,164,894 B2
(45) Date of Patent: Oct. 20, 2015

(54) STAGGERED PROGRAMMING FOR RESISTIVE MEMORIES

(71) Applicant: Micron Technology Inc., Boise, ID (US)

(72) Inventors: Gerald Barkley, Oregon, WI (US); Sunil Shetty, Folsom, CA (US); Andrea Martinelli, Nembro (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/165,265

(22) Filed: Jan. 27, 2014

(65) Prior Publication Data

US 2014/0143484 A1 May 22, 2014

Related U.S. Application Data

(63) Continuation of application No. 12/779,728, filed on May 13, 2010, now Pat. No. 8,639,903.

(51) Int. Cl.
*G06F 12/00* (2006.01)
*G06F 12/02* (2006.01)
*G11C 13/00* (2006.01)

(52) U.S. Cl.
CPC ........ *G06F 12/0246* (2013.01); *G11C 13/0004* (2013.01); *G11C 13/0061* (2013.01); *G11C 13/0064* (2013.01); *G11C 13/0069* (2013.01); *G11C 2013/0088* (2013.01)

(58) Field of Classification Search
CPC ............ G06F 12/0246; G11C 13/0004; G11C 13/0061; G11C 13/0069; G11C 13/0064
USPC ................... 711/103, 170, 169, 173, E12.001
See application file for complete search history.

(56) References Cited

U.S. PATENT DOCUMENTS

| | | | |
|---|---|---|---|
| 6,609,187 B1 * | 8/2003 | Merrell et al. | 711/173 |
| 6,944,058 B2 | 9/2005 | Wong | |
| 7,082,051 B2 | 7/2006 | Ha et al. | |
| 7,356,663 B2 * | 4/2008 | Jain | 711/173 |
| 7,529,124 B2 | 5/2009 | Cho et al. | |
| 2004/0168014 A1 * | 8/2004 | Lofgren et al. | 711/103 |
| 2006/0087891 A1 | 4/2006 | Jeong et al. | |
| 2010/0226163 A1 * | 9/2010 | Savransky | 365/148 |

FOREIGN PATENT DOCUMENTS

| | | |
|---|---|---|
| CN | 1679117 A | 10/2005 |
| JP | 2004-79002 | 3/2004 |

(Continued)

OTHER PUBLICATIONS

Chen, et al., "Non-Volatile Resistive Switching for Advanced Memory Applications," IEEE IEDM, Dec. 5-7, 2005.*

(Continued)

*Primary Examiner* — Pierre-Michel Bataille
(74) *Attorney, Agent, or Firm* — Knobbe Martens Olson and Bear LLP

(57) ABSTRACT

Subject matter disclosed herein relates to a memory device and method of programming same. In some embodiments, a memory device can be programmed by partitioning information into a plurality of chunks. Partitioning can be performed by determining a pattern of logic ones and zeroes, and setting a size of an information chunk based on the pattern of logic ones and zeroes.

19 Claims, 5 Drawing Sheets

(56) References Cited

FOREIGN PATENT DOCUMENTS

| | | |
|---|---|---|
| JP | 2010-97662 | 4/2010 |
| KR | 2009-009954 A | 1/2009 |
| WO | WO 2004/027908 | 2/2004 |
| WO | WO 2007/146010 A2 | 12/2007 |
| WO | WO 2010/097832 | 4/2010 |

OTHER PUBLICATIONS

Chinese Office Action dated Jul. 16, 2013 of corresponding Chinese Patent Application No. 201110126770.7—5 pages.
Korean Office Action dated Oct. 25, 2012 of corresponding Korean Patent Application 10-2011-0044656.
Korean Office Action dated Apr. 30, 2013 of corresponding Korean Patent Application 10-2011-0044656.
Japanese Office Action dated Jan. 22, 2013 of corresponding Japanese Patent Application 2011-097295.
Chinese Office Action dated Feb. 26, 2014 of corresponding Chinese Patent Application No. 201110126770.7.
German Office Action dated Jun. 5, 2014 of corresponding German Patent Application No. 102011075812.7.
Taiwan Office Action dated Nov. 26, 2013 of corresponding Taiwan Patent Application No. 100116911.

* cited by examiner

STAGGERED PROGRAMMING FOR RESISTIVE MEMORIES

CROSS REFERENCE TO RELATED APPLICATIONS

This application is a continuation of U.S. patent application Ser. No. 12/779,728, filed May 13, 2010, and issued as U.S. Pat. No. 8,639,903.

BACKGROUND

1. Field

Subject matter disclosed herein relates to a memory device and method of programming same.

2. Information

Programming resistive nonvolatile memories may involve relatively large amounts of electrical power. For example, phase change memory (PCM) may operate based, at least in part, on behavior and properties of one or more particular phase change materials that may be selected by resistive heating. PCM materials may comprise chalcogenide alloy and/or germanium antimony telluride (GST), just to name a few examples. Crystalline and amorphous states of such materials may have different electrical resistivities, thus presenting a basis by which information may be stored. A PCM material may transition among amorphous and crystalline states by applying a bias signal to a memory cell. Such a bias signal may comprise electrical current sufficient to allow a phase transition by heating PCM material. Providing or maintaining such a sufficient and/or stable amount of electrical current during programming a memory device may present challenges.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
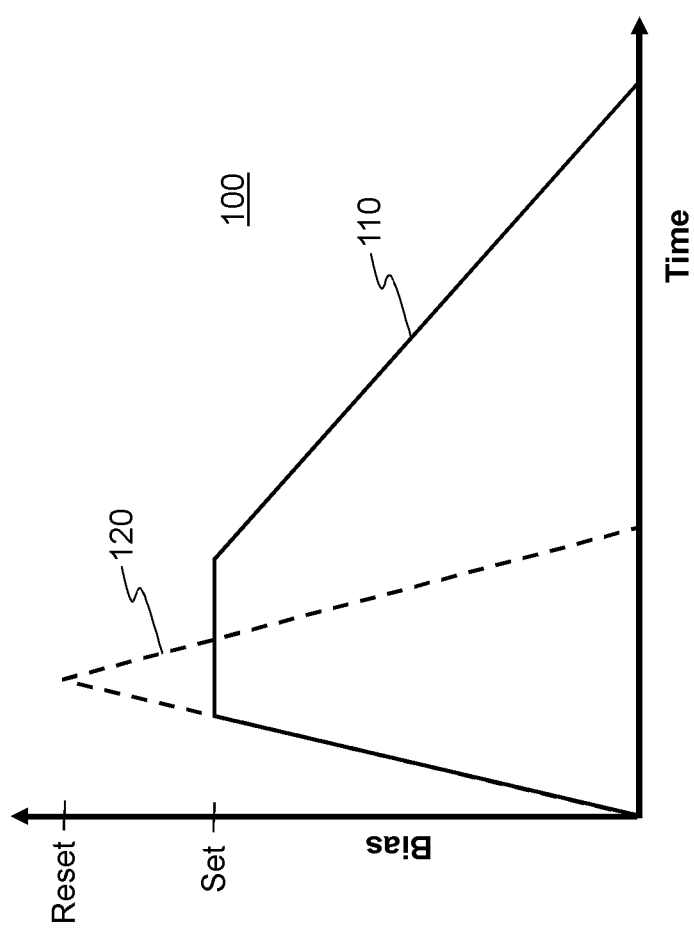
FIG. 1 is a plot of characteristics of bias signal waveforms, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

Embodiments described herein include processes and/or electronic architecture that may address problems resulting from program power variation across memory cells of a memory array while programming the memory array. For example, it may be beneficial to avoid relatively sudden changes in current consumption to reduce stray inductances. A relatively large change of current with respect to time may result in relatively large voltage drops on memory device supply lines, preventing the memory device from working properly. On the other hand, a relatively steady current and/or small change of current with respect to time may improve internal memory chip performance and external system design by reducing voltage variation resulting from parasitic inductance along current paths. For example, internal voltage variation in a memory chip may be easier to manage with a relatively steady current, and external system design may utilize relatively small capacitors. Maintaining substantially constant power while simultaneously programming a relatively large number of resistive memory cells may be difficult due to a finite output resistance of a high voltage source supplying programming power. In particular, it may be desirable to program resistive nonvolatile memories using substantially constant power to program memory cells relatively quickly and reliably. In one implementation, information to be programmed into memory cells and/or the memory cells themselves may be grouped and/or partitioned into relatively small chunks to be programmed in a staggered sequential fashion. Such staggered program pulses during a programming process may provide a benefit by effectively raising resistance seen by a high voltage source supplying the program pulses, thus reducing power variation across programmed memory cells. Of course, other benefits may be realized by such embodiments and claimed subject matter is not so limited.

In one embodiment, a process to program information into a memory array may comprise partitioning information into two or more information chunks, and programming a first portion of the information chunks to the memory array while concurrently preparing to program a second portion of the information chunks to the memory array. Such preparation, for example, may include determining whether particular cells of a memory array are to be set or reset to subsequently program portions of the information chunks. Such a process of programming one portion of the chunks while preparing to program another portion of the chunks may result in portions of the chunks being sequentially programmed in a staggered fashion. Such a process of programming a memory array may involve transmitting particularly-shaped electronic signals to bit lines of the memory array. For example, such signals may comprise a ramping-down bias signal or set pulse to crystallize an active volume of phase change material in a phase change memory (PCM) cell during a setting phase of memory operation. Such a setting phase may result from a write command directed to the PCM, for example, by a memory controller. Such a bias signal, of course, may comprise a variety of characteristic shapes and/or configurations, and claimed subject matter is not limited in this respect.

FIG. 1 is a plot 100 of characteristics of bias signal waveforms, according to an embodiment. Such bias signal waveforms may be used to program a PCM memory cell by setting or resetting the memory cell, for example. As mentioned above, a PCM cell may be reset by melting phase change material by applying a relatively high amplitude, relatively short duration electrical programming pulse or bias signal 120. In a reset state, an active region of phase change material may comprise an amorphous region that is dome-shaped, disposed adjacent to a heater element in a PCM cell, for example. Crystallized phase change material may surround such an amorphous region. In such a state, a PCM cell may have a relatively high electrical resistance. In a subsequent process, a PCM cell may be set by crystallizing a dome-shaped amorphous region so that a substantially entire region of phase change material may be crystalline. Such a process may involve ramping down a voltage and/or current of relatively low amplitude, relatively long duration bias signal 110 applied to a PCM cell to crystallize its phase change material. In such a state, a PCM cell may have a relatively low electrical resistance. Such a process of crystallizing a dome-shaped amorphous region may be performed relatively quickly in order to benefit operational performance (e.g., speed) of the PCM cell. However, performing such crystallization too quickly may result in non-crystallized amorphous regions and/or imperfections in the phase change material, resulting in a higher-than-desired electrical resistance. In other words, such a crystallization process may involve a ramping-down bias signal that provides enough time to fully crystallize a dome-shaped amorphous region without adversely producing amorphous regions and/or imperfections. Accordingly, a process of programming a PCM cell may involve various program times (e.g., duration of a bias signal) and/or electrical power (e.g., magnitude of a bias signal) depending, at least in part, on whether the PCM cell is to be programmed with a logic one or zero. Thus, as described in detail below, a process of programming information into a memory array may include firstly determining which particular memory cells of the memory array are to be set or reset based, at least in part, on a pattern of the information, and secondly programming the information to the memory cells. Of course, such details of bias signals and programming memory cells are merely examples, and claimed subject matter is not so limited.

Figure 2:
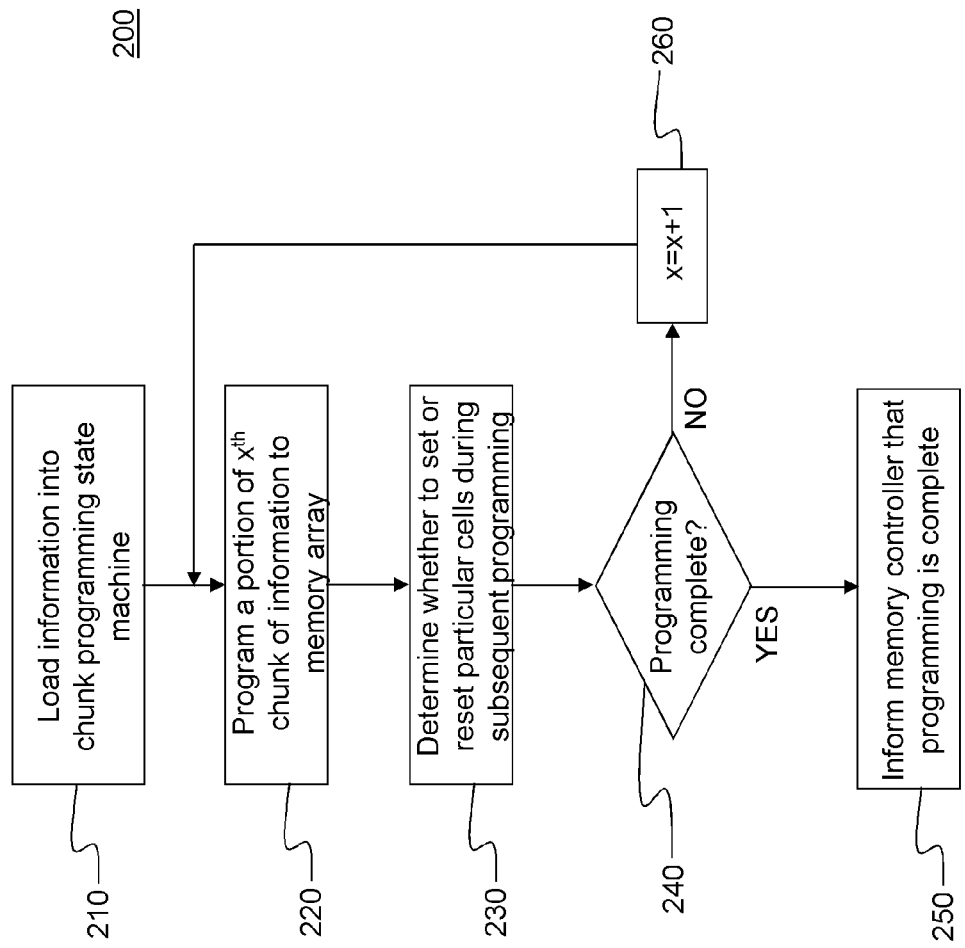
FIG. 2 is a flow diagram of a process to program memory, according to an embodiment.
Figure 3:
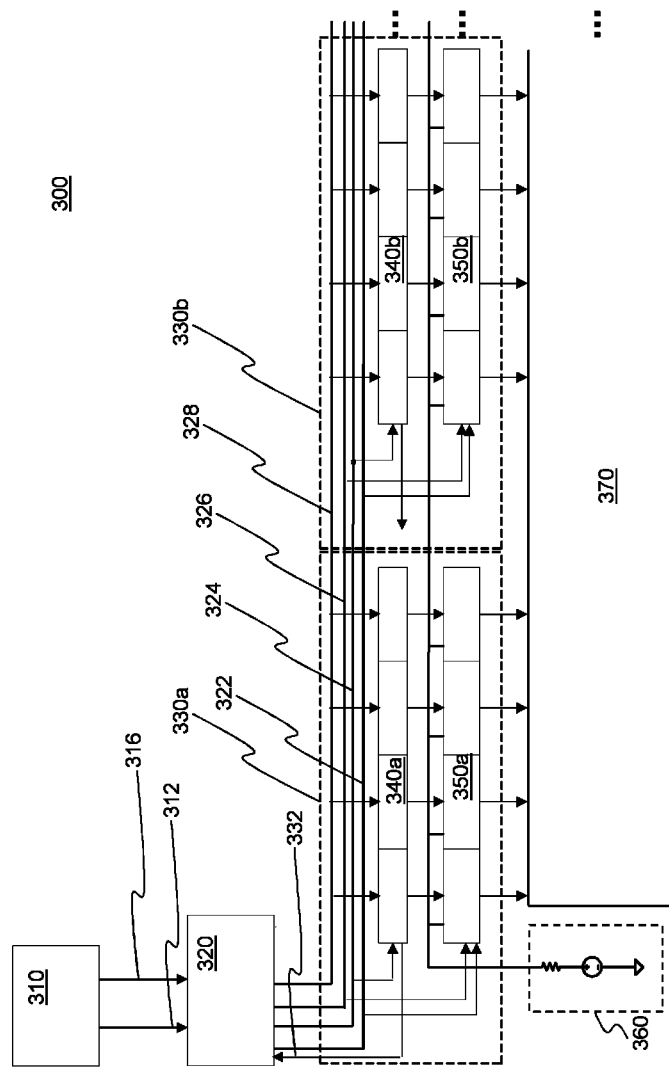
FIG. 3 is a schematic diagram of a memory device, according to an embodiment.

FIG. 2 is a flow diagram of a process 200 to program a memory device and FIG. 3 is a schematic diagram of a memory device 300, according to an embodiment. Memory device 300 may comprise a memory controller 310, global program state machine (GPSM) 320, chunk programming state machines (CPSM) 340a and 340b, program switches 350a and 350b, and memory array 370. In addition, programming voltage source 360 may provide power to memory device 300 via program switches 350a and 350b during program operations. CPSM 340a may be associated with first chunk 330a, CPSM 340b may be associated with second chunk 330b, and so on. In an implementation, first chunk 330a and/or second chunk 330b may have a variable size to be determined dynamically, as described below in detail. Similarly, program switches 350a may be associated with first chunk 330a, program switches 350b may be associated with second chunk 330b, and so on. Herein, 330, 340, and 350, unless stated otherwise, refer to a series of chunks, CPSMs, and program switches, respectively, though only two of each such series are shown in FIG. 3. Thus, it is to be understood that memory device 300 may continue to the right in FIG. 3 and include additional chunks 330, CPSMs 340, and program switches 350, for example. In addition, it is to be understood that interconnections and/or configuration among elements shown in FIG. 3 may continue to the right and include additional chunks, CPSMs, and/or program switches 350. Though arrows in FIG. 3 may be single-ended to correspond to descriptions of particular embodiments and/or implementations that follow, any or all such arrows may as well be double-ended to indicated flow in either one or both directions, and claimed subject matter is not limited in this respect. At block 210, in response to an instruction 312 from memory controller 310, information to be stored in memory array 370 may be loaded into CPSM 340 from GPSM 320. Such information may be loaded via bus 328 into respective chunks 330, for example. During a process of programming such information to memory array 370, at block 220, a first portion of information may be programmed to a first portion of memory array 370 associated with first chunk 330a. Concurrent with such programming, at block 230, CPSM 340b may determine whether particular cells of a portion of memory array 370 associated with second chunk 330b are to be set or reset based, at least in part, on position of the particular cells relative to a bit pattern (e.g., pattern of logic ones or zeroes) of the information to be stored, for example. In one implementation, CPSM 340b, for example, may dynamically determine the number of memory cells to be grouped into a particular subsequent memory array chunk. Such a number may be kept below a particular number determined by considering available programming current in a particular embodiment. In other words, memory array chunks need not have a fixed size, but instead may have a variable size based, at least in part, on information (e.g., 0's and 1's) of the subsequent chunk to be programmed, for example. In this way, a state machine may dynamically determine the number of memory cells gathered into a subsequent memory array chunk. Benefits may be realized by programming information in one chunk while concurrently determining a programming bit pattern for a subsequent chunk (to be programmed). Such benefits of programming information using chunks may include reduced variations of power demand during programming processes, as explained in detail below.

Within individual chunks 330, CPSMs 340 may identify memory cells in memory array 370 that are to be programmed based, at least in part, on cell position and bandwidth, while previous information is being programmed, as mentioned above. Here, bandwidth may refer to the number of memory cells that may be pulsed at the same time. For example, CPSMs 340 may analyze a pattern to be programmed and may select a number of memory cells to be pulsed on a next program pulse. Individual CPSMs may attempt to use available bandwidth until the individual CPSMs complete a pulsing process of a user pattern. As discussed in detail below, programming may or may not comprise providing a pulse to a bit line of a memory cell based, at least in part, on whether such a memory cell is to store logic one or zero (e.g., set state or reset state). Once programming has completed for previous information, GPSM 320 may provide a sequence of staggered trigger signals to individual chunks 330, as described in further detail below. Providing such a sequence of trigger signals may be initiated by memory controller 310, for example. Such a sequence of trigger signals may load a new pattern of information to be programmed and may also result in loading CPSM 330 with information for a subsequent pulse pattern. Subsequent information to be programmed may be loaded into CPSM 330 while the CPSM 330 provides a sequence of trigger signals, for example. At block 240, process 200 may proceed to block 250 if programming is complete, wherein information has been written to memory array 370. On the other hand, if additional information is to be programmed to memory array 370, then process 200 may proceed to block 260 where an index may be incremented and process 200 may return to block 220 so that subsequent portions of chunks may be programmed as described above. In one implementation, such an index may represent a sequence number among a plurality of portions of information among chunks that may be sequentially programmed. Of course, such details of a process 200 to program a memory device are merely examples, and claimed subject matter is not so limited.

Figure 4:
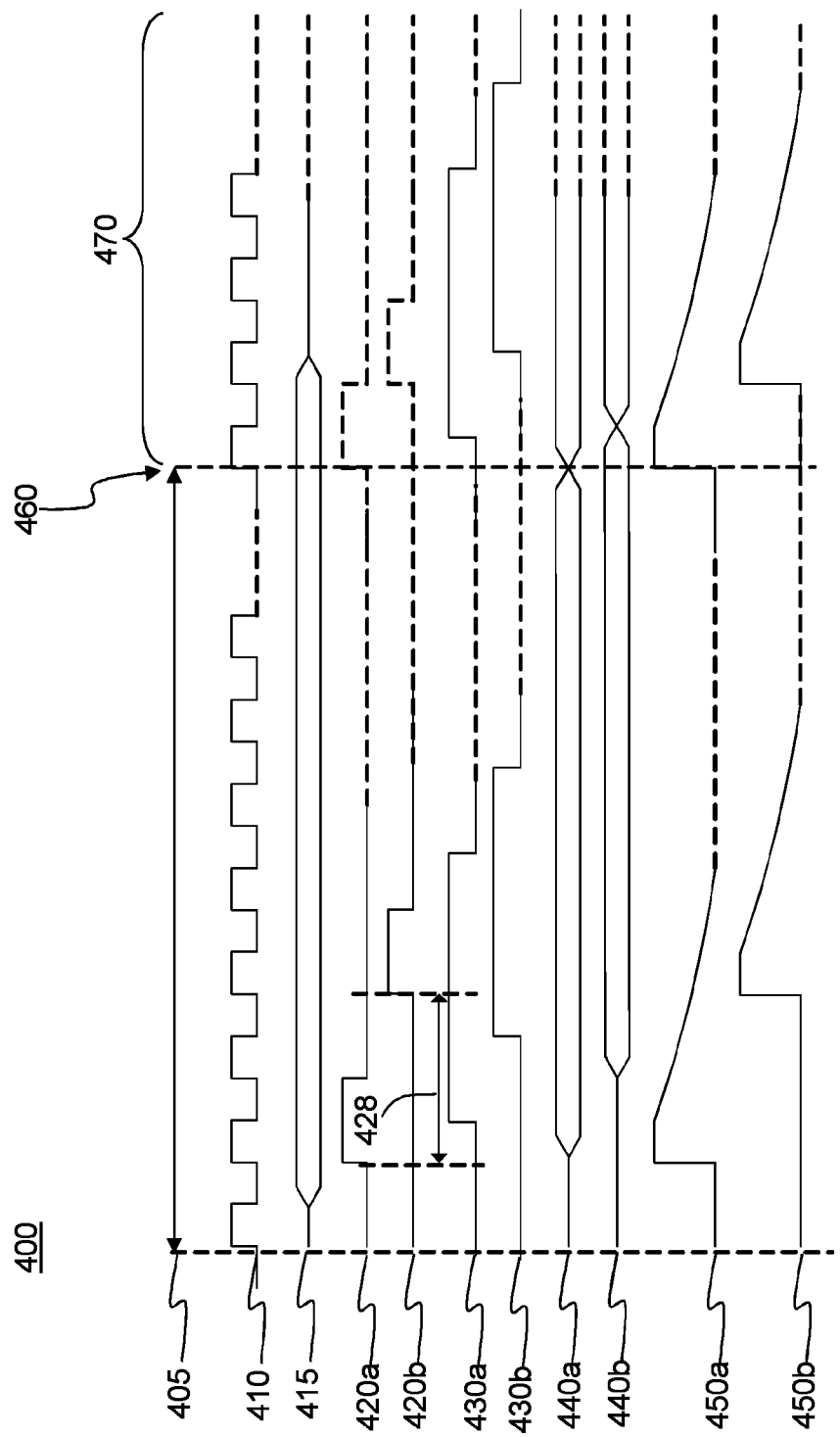
FIG. 4 is a timing diagram for a memory device, according to an embodiment.

FIG. 4 shows a timing diagram 400 for memory device 300, according to an embodiment. As described above, in response to an instruction 312 issued by memory controller 310, GPSM 320 may load a pattern of information to be programmed to memory array 370 into CPSM 340 via bus 328. Such a pattern of information may be partitioned into portions that and loaded into individual respective chunks 330. For example, a first portion of information may be loaded into chunk 330a, a second portion of information may be loaded into chunk 330b, and so on. Within individual chunks 330, CPSM 340 may identify memory cells that are to be programmed using a set pulse as opposed to being programmed using a reset pulse, for example. Such identification may be based on memory cell position and/or bandwidth. Identification of whether or not memory cells are to be set or reset may be performed before pulsing begins. Which memory cells are to be programmed may be determined based, at least in part, on cell position and/or bandwidth, for example. In one implementation, different portions of information in respective chunks 330 may be programmed at different times. In particular, programming such portions of information may be carried out in a staggered fashion, as discussed above. In one staggered programming technique, for example, a first portion of information may be programmed while a second portion of information is concurrently being prepared to be programmed by determining which memory cells are to be set or reset, as discussed above. In such a case, the second portion may be programmed after the first portion is already programmed. Referring to FIG. 4, for example, a first portion of information may be programmed during time span 405 and a second portion of information may be programmed during time span 470, as described in detail below. In one implementation, for example, first portions of information in respective chunks 330 may be programmed during time span 405 and second portions of information in the respective chunks 330 may be programmed during time span 470, as described in detail below.

After processes of programming a first portion, a second portion, and additional portions of information are complete, memory device 300 may prepare to program yet further information into memory array 370, for example. Again referring to FIG. 4 to describe a process of programming such further information, GPSM 320 may issue a sequence of staggered program trigger pulses 420a and 420b to first chunk 330a and second chunk 330b upon receiving a kick-off signal issued by memory controller 310 via line 316. Upon issuance of such a kick-off signal, a new pattern of information 415 to be programmed in a staggered fashion may be loaded into CPSM 340. In particular, a first portion of such a new pattern of information may be loaded into CPSM 340 to be programmed during a first time span 405 while a second portion of such a new pattern of information may be loaded into CPSM 340 to be subsequently programmed during a second time span 470. Clock signal 405 may provide timing for synchronous programming operations, though claimed subject matter is not limited in this respect. Staggered program trigger pulses 420a and 420b may initiate programming of individual memory cells. For example, program trigger pulse 420a may initiate a program pulse 450a to be applied to a bit line of one or more memory cells associated with chunk 330a. After a particular staggered delay time, a subsequent program trigger pulse 420b may initiate program pulse 450b to be applied to a bit line of one or more memory cells associated with chunk 330b. In one implementation, such a particular time delay may be selected based, at least in part, on a selected average power delivered to the bit lines. Either program pulse 450a or 450b may comprise a relatively low amplitude, relatively long duration set pulse, such as bias signal 110, or a relatively high amplitude, relatively short duration reset pulse, such as bias signal 120 shown in FIG. 1. Accordingly, a time to program a pattern of information may depend, at least in part, on the logical composition of the pattern, e.g., a number of memory cells to be set versus a number of memory cells to be reset during programming of the pattern of information. Thus, while a first portion of information is being programmed during first time span 405, a determination of the composition of a second portion of information may be concurrently carried out to prepare for programming the second portion during a subsequent second time span 470, for example.

Meanwhile, LDDISCHARGE signal 430 may be selectively set while program set pulses are applied to particular memory cells to provide timing for discharging bit lines associated with the particular memory cells, as described in further detail below. For example, LDDISCHARGE signal 430a may be selectively set while program set pulse 450a is applied to a particular memory cell associated with chunk 330a, and LDDISCHARGE signal 430b may be selectively set while program set pulse 450b is applied to a particular memory cell associated with chunk 330b. Signal 440a may comprise a particular pattern of information to be programmed into memory cells associated with chunk 330a, and signal 440b may comprise a particular pattern of information to be programmed into memory cells associated with chunk 330b. At time 460, a process of programming a first portion of information among chunks 330 may be complete. At such a time, a second portion of information among chunks 330 may begin to be programmed in a fashion described above for the first portion. Accordingly, such a cycle of programming may continue until all portions of information among chunks 330 are programmed into memory array 370, for example. Of course, such details of timing diagram 400 are merely examples, and claimed subject matter is not so limited.

In one implementation, GPSM 320 may provide n staggered program trigger pulses 420a and 420b during a time span of PULSETIME 405 (previously referred to as a first time span). Accordingly, GPSM 320 may provide staggered program trigger pulses 420a and 420b every (PULSETIME)/n. Thus, system clock 410 may operate with a frequency given by n/(PULSETIME). Individual CPSM 340 may issue a LDNOPULSE<n> signal via line 332 after all memory cells to be programmed have been programmed. Consequently, the staggered programming sequence may stop after all chunks 330 have registered their respective LDNOPULSE signal.

In one implementation, an LDDISCHARGE signal 430 may be issued to individual chunks 330 during a 'set' operation of particular memory cells, as mentioned above. In particular, LDDISCHARGE signal 430a may be issued to chunk 330a, LDDISCHARGE signal 430b may be issued to chunk 330b, and so on during a 'set' operation. LDDISCHARGE signal 430 may be held at logic high through the duration of discharge of a bit line associated with particular memory cells being programmed. A 'reset' operation need not involve such an LDDISCHARGE signal. Accordingly, pulse width, herein comprising a time span between the rising edge of a trigger pulse 420 to a falling edge of LDDISCHARGE signal 430, may be determined by loading of a subsequent information pattern or an explicit LDSTOPPULSE signal issued to individual chunks 330 via line 322, for example. In a particular implementation, such an LDSTOPPULSE signal may provided to individual chunks 330 in a staggered fashion by GPSM 320.

Prior to program operations of a memory array, the time 428 between individual staggered program trigger pulses 420a and 420b and/or pulse widths of individual LDDISCHARGE signals 430 may be configured by memory controller 310 to satisfy various conditions of memory cells of the memory array at different trim settings. Here, trim settings may comprise internal configuration signals that may change time 428 and/or change the pulse width of LDDISCHARGE signals 430. Such configuration signals may be loaded during device power-up, for example. During program operations, pulse widths of individual LDDISCHARGE signals 430 may be configured by GPSM 320 based, at least in part, on whether a particular memory cell is being set or reset and/or an intrinsic discharge time associated with the particular memory cell. In one implementation, CPSM 340 may distribute staggered program trigger pulses 420a and 420b to program switches 350, which may provide programming voltage from programming voltage source 360 to memory cells in memory array 370. Such program switches may operate based, at least in part, on staggered program trigger pulses 420 and may provide a beneficial relatively constant programming voltage to memory cells. Program switches 350 may achieve such a relatively constant programming voltage by effectively raising load resistance compared to a voltage source resistance, thus reducing an amount of voltage and power variation in memory cells. Of course, such details of programming a memory array are merely examples, and claimed subject matter is not so limited.

Figure 5:
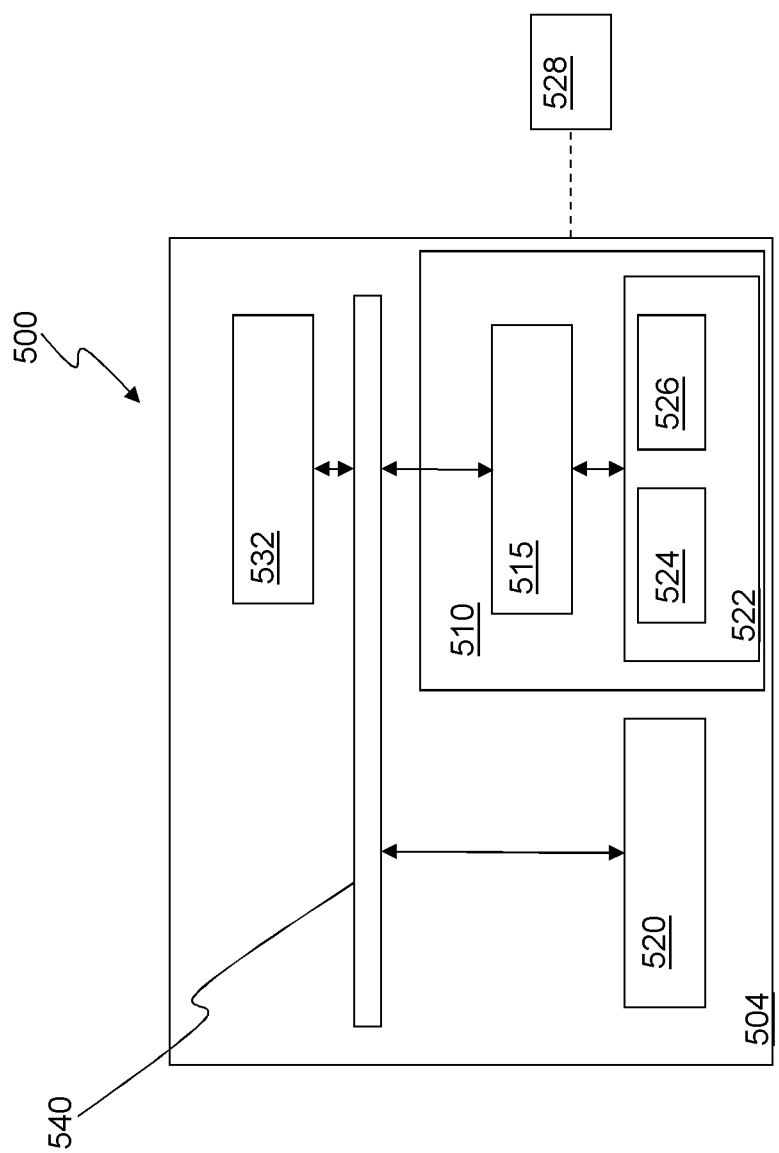
FIG. 5 is a schematic view of a computing system and a memory device, according to an embodiment.

FIG. 5 is a schematic diagram illustrating an exemplary embodiment of a computing system 500 including a memory device 510. Such a computing device may comprise one or more processors, for example, to execute an application and/or other code. For example, memory device 510 may comprise a memory array 370 shown in FIG. 3. A computing device 504 may be representative of any device, appliance, or machine that may be configurable to manage memory device 510. Memory device 510 may include a memory controller 515 and a memory 522. By way of example but not limitation, computing device 504 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 500, and the processes and methods as further described herein, may be implemented using or otherwise including hardware, firmware, software, or any combination thereof. Thus, by way of example but not limitation, computing device 504 may include at least one processing unit 520 that is operatively coupled to memory 522 through a bus 540 and a host or memory controller 515. Processing unit 520 is representative of one or more circuits configurable to perform at least a portion of a data computing procedure or process. By way of example but not limitation, processing unit 520 may include one or more processors, controllers, microprocessors, microcontrollers, application specific integrated circuits, digital signal processors, programmable logic devices, field programmable gate arrays, and the like, or any combination thereof. Processing unit 520 may include an operating system configured to communicate with memory controller 515. Such an operating system may, for example, generate commands to be sent to memory controller 515 over bus 540. Such commands may comprise read and/or write commands. In response to a write command, for example, memory controller 515 may provide a bias signal, such as a set or reset pulse to write information associated with the write command to a memory partition, for example. In another example, memory controller 515 may provide erase commands to a memory device that includes an IMM portion to store data in the memory device using two or more program states that are accessible by the memory controller. Such an IMM may also program memory locations storing data in a hidden state that is defined internally to the memory device in response to receiving an erase command from the memory controller.

Memory 522 is representative of any data storage mechanism. Memory 522 may include, for example, a primary memory 524 and/or a secondary memory 526, each of which may be partitioned into one or more partitions as discussed above, for example. Primary memory 524 may include, for example, a random access memory, read only memory, etc. While illustrated in this example as being separate from processing unit 520, it should be understood that all or part of primary memory 524 may be provided within or otherwise co-located/coupled with processing unit 520.

In one embodiment, computing system 500 may comprise a memory device comprising a memory array, a GPSM to partition information into two or more information chunks, and a CPSM to program one of the information chunks into the memory array while concurrently determining whether a particular cell of the memory array is to be set or reset to program a subsequent one of the information chunks. System 500 may further include a processor to host one or more applications and to initiate commands to the memory device to provide access to the memory array.

Secondary memory 526 may include, for example, the same or similar type of memory as primary memory and/or one or more data storage devices or systems, such as, for example, a disk drive, an optical disc drive, a tape drive, a solid state memory drive, etc. In certain implementations, secondary memory 526 may be operatively receptive of, or otherwise configurable to couple to, a computer-readable medium 528. Computer-readable medium 528 may include, for example, any medium that can carry and/or make accessible data, code, and/or instructions for one or more of the devices in system 500.

Computing device 504 may include, for example, an input/output 532. Input/output 532 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 532 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A memory device comprising:
   a first state machine configured to:
   partition information into a plurality of information chunks;
   determine a pattern of logic ones and zeroes to be used for storing the information; and
   set a size of an information chunk based on the pattern of logic ones and zeroes; and
   a second state machine configured to program the information in the plurality of information chunks into a number of memory cells in a memory array;

wherein each of the plurality of information chunks is configured to have a variable size based on the partitioning.

2. The memory device of claim 1, wherein the first state machine is configured to set the size of the information chunks based on a pattern of the logic ones and zeroes subsequent to the information chunk.

3. The memory device of claim 1, wherein the logic ones correspond to one of a reset state and a set state and the logic zeroes correspond to the other of the reset state and the set state.

4. The memory device of claim 1, wherein the second state machine is configured to sequentially program a memory array with information in a first and a second information chunk of the plurality of information chunks.

5. The memory device of claim 4, wherein the memory array comprises a phase change material (PCM) memory array.

6. The memory device of claim 4, wherein the memory array comprises a resistive memory array.

7. The memory device of claim 1, further comprising:
a memory controller to provide the information to the first and second state machines.

8. A system comprising:
a memory device comprising:
  a memory array;
  a first state machine configured to:
    partition information into a plurality of information chunks;
    determine a pattern of logic ones and zeroes to be used for storing the information; and
    set a size of an information chunk based on the pattern of logic ones and zeroes; and
  a second state machine configured to program the information in the plurality of information chunks into a number of memory cells in a memory array; and
a processor to host one or more applications and to initiate commands to the memory device to provide access to the memory array;
wherein each of the plurality of information chunks is configured to have a variable size based on the partitioning.

9. The system of claim 8, wherein the first state machine is configured to set the size of the information chunks based on a pattern of the logic ones and zeroes subsequent to the information chunk.

10. The system of claim 8, wherein the logic ones correspond to one of a reset state and a set state and the logic zeroes correspond to the other of the reset state and the set state.

11. The system of claim 8, wherein the second state machine is configured to sequentially program a memory array with information in a first and a second information chunk of the plurality of information chunks.

12. The system of claim 11, wherein the memory array comprises a phase change material (PCM) memory array.

13. The system of claim 8, further comprising:
a memory controller to provide the information to the first and second state machines.

14. A method for programming a memory device, comprising:
partitioning information into a plurality of information chunks, wherein partitioning information comprises:
  determining a pattern of logic ones and zeroes for storing the information; and
  setting a size of an information chunk based on the pattern of logic ones and zeroes; and
programming the information in the plurality of information chunks into a number of memory cells in a memory array;
wherein each of the plurality of information chunks is configured to have a variable size based on the partitioning.

15. The method of claim 14, wherein setting the size of the information chunks is based on a pattern of the logic ones and zeroes subsequent to the information chunk.

16. The method of claim 14, wherein the logic ones correspond to one of a reset state and a set state and the logic zeroes correspond to the other of the reset state and the set state.

17. The method of claim 14, wherein information in a first and second information chunk of the plurality of information chunks is programmed into the memory array sequentially.

18. The method of claim 14, wherein the memory array comprises a phase change material (PCM) memory array.

19. The method of claim 14, wherein a maximum number of memory cells of the memory array to be programmed is determined based at least on an amount of available programming current.

\* \* \* \* \*